(12) United States Patent
Schmidt et al.

(10) Patent No.: US 8,389,321 B2
(45) Date of Patent: Mar. 5, 2013

(54) PROTECTIVE LAYER FOR LARGE-SCALE PRODUCTION OF THIN-FILM SOLAR CELLS

(75) Inventors: Chris Schmidt, Redwood City, CA (US); John Corson, Mountain View, CA (US)

(73) Assignee: MiaSole, Santa Clara, CA (US)

(*) Notice: Subject to any disclaimer, the term of this patent is extended or adjusted under 35 U.S.C. 154(b) by 0 days.

(21) Appl. No.: 13/230,305

(22) Filed: Sep. 12, 2011

(65) Prior Publication Data

US 2011/0318868 A1 Dec. 29, 2011

Related U.S. Application Data

(62) Division of application No. 12/379,427, filed on Feb. 20, 2009, now Pat. No. 8,110,738.

(51) Int. Cl.
*H01L 21/00* (2006.01)
(52) U.S. Cl. ............ 438/69; 438/84; 136/264; 136/265; 257/E21.04
(58) Field of Classification Search .................... 438/65, 438/69, 84; 136/264, 265; 257/E21.04
See application file for complete search history.

(56) References Cited

U.S. PATENT DOCUMENTS

| | | | |
|---|---|---|---|
| 4,356,073 A | 10/1982 | McKelvey | |
| 5,435,965 A | 7/1995 | Mashima et al. | |
| 5,522,535 A | 6/1996 | Ivanov et al. | |
| 5,626,688 A | 5/1997 | Probst et al. | |
| 5,814,195 A | 9/1998 | Lehan et al. | |
| 5,904,966 A | 5/1999 | Lippens | |
| 6,020,556 A | 2/2000 | Inaba et al. | |
| 6,310,281 B1 | 10/2001 | Wendt et al. | |
| 6,372,538 B1 | 4/2002 | Wendt et al. | |
| 6,500,733 B1 | 12/2002 | Stanbery | |
| 6,525,264 B2 | 2/2003 | Ouchida et al. | |
| 6,559,372 B2 | 5/2003 | Stanbery | |

(Continued)

FOREIGN PATENT DOCUMENTS

| | | |
|---|---|---|
| JP | 2001339081 A | 12/2001 |
| KR | 1020080064814 A | 7/2008 |

(Continued)

OTHER PUBLICATIONS

International Preliminary Report on Patentability issued in PCT Application PCT/US2010/024406, mailed on Aug. 23, 2011.

(Continued)

*Primary Examiner* — David Vu
*Assistant Examiner* — Earl Taylor
(74) *Attorney, Agent, or Firm* — The Marbury Law Group, PLLC

(57) ABSTRACT

A solar cell includes a substrate, a protective layer located over a first surface of the substrate, a first electrode located over a second surface of the substrate, at least one p-type semiconductor absorber layer located over the first electrode, an n-type semiconductor layer located over the p-type semiconductor absorber layer, and a second electrode over the n-type semiconductor layer. The p-type semiconductor absorber layer includes a copper indium selenide (CIS) based alloy material, and the second electrode is transparent and electrically conductive. The protective layer has an emissivity greater than 0.25 at a wavelength of 2 μm, has a reactivity with a selenium-containing gas lower than that of the substrate, and may differ from the first electrode in at least one of composition, thickness, density, emissivity, conductivity or stress state. The emissivity profile of the protective layer may be uniform or non-uniform.

9 Claims, 10 Drawing Sheets

U.S. PATENT DOCUMENTS

| | | | |
|---|---|---|---|
| 6,593,213 B2 | 7/2003 | Stanbery | |
| 6,690,041 B2 | 2/2004 | Armstrong et al. | |
| 6,736,986 B2 | 5/2004 | Stanbery | |
| 6,750,394 B2 | 6/2004 | Yamamoto et al. | |
| 6,787,692 B2 | 9/2004 | Wada et al. | |
| 6,797,874 B2 | 9/2004 | Stanbery | |
| 6,822,158 B2 | 11/2004 | Ouchida et al. | |
| 6,852,920 B2 | 2/2005 | Sager et al. | |
| 6,878,612 B2 | 4/2005 | Nagao et al. | |
| 6,881,647 B2 | 4/2005 | Stanbery | |
| 6,936,761 B2 | 8/2005 | Pichler | |
| 6,987,071 B1 | 1/2006 | Bollman et al. | |
| 7,045,205 B1 | 5/2006 | Sager | |
| 7,115,304 B2 | 10/2006 | Roscheisen et al. | |
| 7,122,392 B2 | 10/2006 | Morse | |
| 7,122,398 B1 | 10/2006 | Pichler | |
| 7,141,449 B2 | 11/2006 | Shiozaki | |
| 7,148,123 B2 | 12/2006 | Stanbery | |
| 7,163,608 B2 | 1/2007 | Stanbery | |
| 7,194,197 B1 | 3/2007 | Wendt et al. | |
| 7,196,262 B2 | 3/2007 | Gronet | |
| 7,227,066 B1 | 6/2007 | Roscheisen et al. | |
| 7,235,736 B1 | 6/2007 | Buller et al. | |
| 7,247,346 B1 | 7/2007 | Sager et al. | |
| 7,253,017 B1 | 8/2007 | Roscheisen et al. | |
| 7,259,322 B2 | 8/2007 | Gronet | |
| 7,262,392 B1 | 8/2007 | Miller | |
| 7,267,724 B2 | 9/2007 | Tanaka et al. | |
| 7,271,333 B2 | 9/2007 | Fabick et al. | |
| 7,291,782 B2 | 11/2007 | Sager et al. | |
| 7,306,823 B2 | 12/2007 | Sager et al. | |
| 7,319,190 B2 | 1/2008 | Tuttle | |
| 7,374,963 B2 | 5/2008 | Basol | |
| 7,785,921 B1 | 8/2010 | Juliano et al. | |
| 7,897,020 B2* | 3/2011 | Mackie et al. | 204/192.26 |
| 8,110,738 B2* | 2/2012 | Schmidt et al. | 136/254 |
| 8,115,095 B2* | 2/2012 | Schmidt et al. | 136/254 |
| 8,134,069 B2* | 3/2012 | Mackie et al. | 136/264 |
| 2005/0109392 A1 | 5/2005 | Hollars | |
| 2007/0074969 A1 | 4/2007 | Simpson et al. | |
| 2007/0283996 A1 | 12/2007 | Hachtmann et al. | |
| 2007/0283997 A1 | 12/2007 | Hachtmann et al. | |
| 2008/0000518 A1 | 1/2008 | Basol | |
| 2008/0053519 A1 | 3/2008 | Pearce et al. | |
| 2008/0142071 A1 | 6/2008 | Dorn et al. | |
| 2008/0314432 A1 | 12/2008 | Paulson et al. | |
| 2009/0014049 A1 | 1/2009 | Gur et al. | |
| 2009/0014057 A1 | 1/2009 | Croft et al. | |
| 2009/0014058 A1 | 1/2009 | Croft et al. | |
| 2009/0199894 A1 | 8/2009 | Hollars et al. | |
| 2010/0212732 A1* | 8/2010 | Schmidt et al. | 136/256 |
| 2010/0212733 A1* | 8/2010 | Schmidt et al. | 136/256 |
| 2010/0258191 A1* | 10/2010 | Mackie | 136/264 |
| 2011/0162696 A1* | 7/2011 | Vlcek et al. | 136/255 |
| 2011/0318868 A1* | 12/2011 | Schmidt et al. | 438/95 |
| 2012/0003785 A1* | 1/2012 | Mackie | 438/84 |

FOREIGN PATENT DOCUMENTS

| | | | |
|---|---|---|---|
| KR | 1020090005324 A | 1/2009 | |

OTHER PUBLICATIONS

Bodegård et al., "The influence of sodium on the grain structure of CuInSo$_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.

Contreras et al., "On the role of Na and modifications to Cu(In,Ga)Se$_2$ absorber materials using thin-MF (M=Na, K, Cs) precursor layers," 26$^{th}$ IEEE PVSC, Anaheim, California, Sep. 30-Oct. 3, 1997, 359-362.

Devaney et al., "Recent improvement in CuInSe$_2$/ZnCdS thin film solar cell efficiency," 18th IEEE Photovoltaic Spec. Conf., 1985, New York, 1733-1734.

Evbuomwan et al., "Concurrent materials and manufacturing process selection in design function deployment," Concurrent Engineering: Research and Applications, Jun. 1995, 3(2):135-144.

Hedström et al., "ZnO/CdS/Cu(In,Ga)Se$_2$ thin film solar cells with improved performance," 23$^{rd}$ IEEE Photovoltaic Specialists Conference, Louisville, Kentucky, May 10-14, 1993, 364-371.

Holz et al., "The effect of substrate impurities on the electronic conductivity in CIS thin films," 12$^{th}$ European Photovoltaic Solar Energy Conference, Proceedings of the International Conference, Amsterdam, The Netherlands, Apr. 11-15, 1994, Hill et al. Ed., vol. II, 1592-1595.

Granath et al., "Mechanical issues of NO back contracts for Cu(In,Ga)Se$_2$ devices," 13th European Photovoltaic Solar Energy Conference, Proceedings of the International Conference, Nice, France, Oct. 23-27, 1995, Freiesleben et al. Ed., vol. II, 1983-1986.

Mickelsen et al., "High photocurrent polycrystalline thin-film CdS/CuInSe$_2$ solar cell," Appl. Phys. Lett., Mar. 1, 1980, 36(5):371-373.

Mohamed et al., "Correlation between structure, stress and optical properties in direct current sputtered molybdenum oxide films," Thin Solid Films, 2003, 429:135-143.

Probst et al., "The impact of controlled sodium incorporated on rapid thermal processed Cu(InGa)Se$_2$-thin films and devices," First WCPEC, Hawaii, Dec. 5-9, 2004, 144-147.

Ramanath et al., "Properties of 19.2% Efficiency ZnO/CdS/CuInGaSe$_2$ Thin-film Solar Cells," Progress in Photovoltaics: Research and Applications, 2003, 11:225-230.

Rau et al., "Cu(In,Ga)Se$_2$ solar cells," Clean Electricity From Photovoltaics, Series on Photoconversion of Solar Energy, vol. 1, 2001, Archer et al. Ed., Chapter 7, 277-345.

Rudmann et al., "Effects of NaF coevaporation on structural properties of Cu(In,Ga)Se$_2$ thin films," Thin Solid Films, 2003, 431-432:37-40.

Sakurai et al,. "Properties of Cu(In,Ga)Se2:Fe Thin Films for Solar Cells," Mater. Res. Soc. Symp. Proc., 2005, 865:F14.12.1-F.14.12.5.

Scofield et al., "Sodium diffusion, selenization, and microstructural effects associated with various molybdenum back contact layers for Cis-based solar cells," Proc. of the 24$^{th}$ IEEE Photovoltaic Specialists Conference, New York, 1995, 164-167.

So et al., "Properties of Reactively Sputtered Mo$_{1-x}$O$_x$ Films," Appl. Phys. A, 1988, 45:265-270.

Stolt et al., "ZnO/CdS/CuInSe$_2$ thin-film solar cells with improved performance," Appl. Phys. Lett., Feb. 8, 1993, 62(6):597-599.

Windischmann, Henry, "Intrinsic Stress in Sputter-Deposited Thin Films," Critical Reviews in Solid State and Materials Science, 1992, 17(6):547-596.

Yun et al., "Fabrication of CIGS solar cells with a Na-doped Mo layer on a Na-free substrate," Thin Solid Films, 2007, 515:5876-5879.

International Search Report and Written Opinion issued in International Application No. PCT/US2010/024406, mailed Sep. 17, 2010.

\* cited by examiner

PROTECTIVE LAYER FOR LARGE-SCALE PRODUCTION OF THIN-FILM SOLAR CELLS

This application is a divisional of, and claims priority benefit to U.S. application Ser. No. 12/379,427, filed Feb. 20, 2009. The present invention relates generally to the field of photovoltaic devices, and more specifically to thin-film solar cells with a protective layer.

FIELD OF THE INVENTION

Background of the Invention

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), and any of these compounds with sulfur replacing some of the selenium represent a group of materials, referred to as CIS based alloys, that have desirable properties for use as the absorber layer in thin-film solar cells. To function as a solar absorber layer these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

SUMMARY OF THE INVENTION

One embodiment of this invention provides a solar cell including a substrate, a protective layer located over a first surface of the substrate, a first electrode located over a second surface of the substrate, at least one p-type semiconductor absorber layer located over the first electrode, an n-type semiconductor layer located over the p-type semiconductor absorber layer, and a second electrode over the n-type semiconductor layer. The p-type semiconductor absorber layer includes a copper indium selenide (CIS) based alloy material. In some embodiments, the protective layer has an emissivity greater than 0.25 at a wavelength of 2 μm, has a reactivity with a selenium-containing gas lower than that of the substrate, and differs from the first electrode in at least one of composition, thickness, density, emissivity, conductivity or stress state. In some embodiments, the emissivity profile of the protective layer is uniform; in other embodiments, the emissivity profile of the protective layer is non-uniform.

Another embodiment of the invention provides a method of manufacturing a solar cell, including depositing a protective layer over a first surface of a substrate, depositing a first electrode over a second surface of the substrate, depositing at least one p-type semiconductor absorber layer over the first electrode, depositing an n-type semiconductor layer over the p-type semiconductor absorber layer to form a p-n junction, and depositing a second electrode over the n-type semiconductor layer. In some embodiments, the protective layer has an emissivity greater than 0.25 at a wavelength of 2 μm, has a reactivity with a selenium-containing gas lower than that of the substrate, and differs from the first electrode in at least one of composition, thickness, density, emissivity, conductivity or stress state. In some embodiments, the emissivity profile of the protective layer is uniform; in other embodiments, the emissivity profile of the protective layer is non-uniform. In some embodiments, the emissivity of the protective layer remains substantially constant during the above steps.

BRIEF DESCRIPTION OF THE DRAWINGS

FIGS. 5a through 5c refer to atomic concentrations deducted from Auger spectra measured on Samples 1a through 1c as shown in FIGS. 4a through 4c, respectively. Starting from the surface of the layer 902, the depth of the film increases towards the front side of the web 100.

DESCRIPTION OF THE PREFERRED EMBODIMENTS

Figure 1:
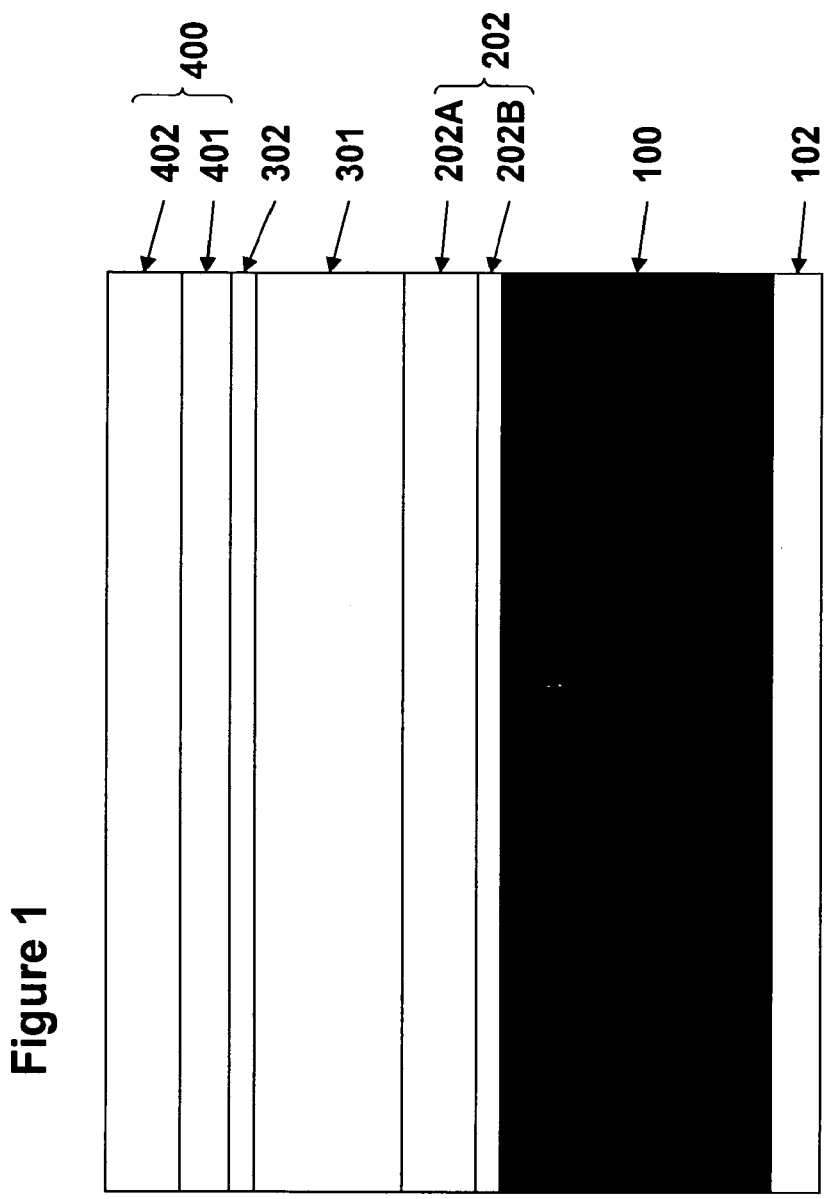
FIG. 1 is a schematic side cross-sectional view of a CIS based solar cell in one embodiment.

U.S. Published Application No. 2005/0109392 A1 ("Hollars"), titled "Manufacture Apparatus and Method for Large-scale production of thin-film solar cells", which is filed on Oct. 25, 2004 and published on May 26, 2005 incorporated herein by reference in its entirety discloses a vacuum sputtering apparatus which includes an input module for paying out a web substrate material from a roll of the substrate material, a plurality of process modules for receiving the substrate material from the input module, and an output module. The process modules include one or more sputtering targets for sputtering material onto the web substrate. The output module receives the substrate material from the process modules. The web substrate can be heated by radiation heaters to obtain a sufficient process temperature for depositing CIS based layers.

This technique taught by Hollars provides a large-scale manufacturing system for the economical production of thin-film CIS based solar cells with significantly lower cost.

However, the back side of the web substrate may react with selenium vapor or other selenium-containing gas under the high process temperature, during the step of reactively sputtering CIS based layer in a selenium ambient. For example, a steel web may react with selenium and form FeSe particles. These FeSe particles might disrupt the process of film deposition and/or the performance of the manufacturing tool.

Furthermore, the web substrate has a relatively high reflectivity, which tends to reflect away a large portion of the incident radiation. For example, a steel web has a reflectivity of approximately 75% at a wavelength of 2 μm. This high reflectivity significantly reduces the energy efficiency of the manufacturing process and may reduce the lifetime of the heating elements.

Still further, the profile of temperature, at which the CIS based layer is deposited, is generally non-uniform due to a non-uniform profile of emissivity resulting from the reaction between the back side of the web and non-uniformly distributed selenium-containing gas. Furthermore, the heat input from the system may be also non-uniform due to non-uniform incident radiation and/or chamber edge effects. CIS based layers such as CIGS layers deposition temperature can affect the layer composition, morphology and mechanical properties. The non-uniformity of growth temperature profile during the CIGS deposition may significantly lower the efficiency and/or reliability of the resulting solar cell.

In one embodiment of the invention, a protective layer is deposited over the back side of the web substrate, prior to the step of depositing the CIS based material. The protective layer may have an emissivity greater than 0.25, for example, around 0.4-0.9 or around 0.5-0.75. Unless otherwise specified, any emissivity value refers to an emissivity at a wavelength of 2.0 μm. The emissivity equals to 1 minus the total reflectivity (R) that may be obtained by using an integrating sphere with an incident angle of approximately 5 degrees from normal.

Further, the protective layer comprises a material having a reactivity with a selenium-containing gas lower than that of the web substrate. More specifically, the protective layer either does not react with the selenium (i.e. does not form a selenium containing compound (e.g., selenide)), or reacts with selenium but at a lower rate than the substrate, such as a steel web substrate, when exposed to a selenium ambient at an elevated temperature. Preferably, the protective layer does not substantially react with a selenium containing gas or ambient. This means that (1) no FeSe particles are formed, or the amount FeSe particles formed is reduced sufficiently that the deposition processes or operation of deposition tool are not disturbed and solar cell device performance is not substantially affected, and/or (2) the emissivity of the protective layer in the wavelength range of interest (~1-5 μm) is not substantially changed by the reaction. For example, the protective layer may react with selenium to the extent that a portion of one alloying element, such as oxygen is replaced by selenium. In a non-limiting example, 10-50% of the oxygen in an oxygen containing molybdenum protective layer may be substituted by selenium. For example, in a molybdenum layer initially containing 20-40 atomic percent oxygen, such as 30 atomic percent oxygen, 10-50 atomic percent of the oxygen can be substituted with selenium such that the final protective layer contains 10-35 atomic percent oxygen, 5-20 atomic percent selenium, and balance molybdenum, such as around 10 atomic percent oxygen, around 10 atomic percent selenium, and balance molybdenum.

The high emissivity of the protective layer and its reduced reactivity with selenium-containing gas provide at least four advantages. First, there is not a substantial amount of FeSe formed. Second, the emissivity of the layer is higher than that of a bare steel web; thus, the radiation heaters can be run with less power, improving the energy and cost efficiency of the process. Third, the emissivity doesn't substantially change in the presence of selenium-containing gas. In other words, the emissivity stays constant during the deposition process. Thus, the unfavorable variations in the temperature profile during the process can be minimized and the process can be run at substantially constant temperature. Fourth, the emissivity of the protective layer can be intentionally adjusted across the web width, compensating for the non-uniformity of the heat input, the chamber edge effects, and/or the non-uniformity of selenium containing gas distribution to provide a uniform temperature profile across the web width. Thus, in one embodiment, the emissivity of the protective layer may have a non-uniform profile when the net heat-input is non-uniform, while in another embodiment, the emissivity of the protective layer may have an uniform profile when the net heat-input is uniform.

FIG. 1 shows a CIS based solar cell structure of a non-limiting example of this invention. A protective layer 102 is located over the first surface (back surface) of a web substrate 100, while a first electrode 202 is located over the second surface (front surface) of the substrate 100. Optionally one or more barrier layers 202B may be located between the primary conductor layer 202A of the electrode 202 and the substrate 100. The substrate 100 may be a metal foil web, for example, stainless steel, aluminum, or titanium foil web. The one or more barrier layers 202B may be any suitable material, for example, a transition metal or metal nitride material, such as Cr, Ti, Nb, TiN, or ZrN.

The protective layer 102 may differ from the first electrode 202 in at least one of composition, thickness, density, emissivity, or stress state. The emissivity of the protective layer 102 may be greater than that of the web substrate 100. In some embodiments, the protective layer 102 has an emissivity greater than 0.25, preferably, greater than 0.3 such as greater than 0.5. In some embodiments, the protective layer 102 has an emissivity different from the emissivity of the first electrode 202. The first electrode may have an emissivity of lower than 0.5, for example, around 0.1-0.3.

The protective layer 102 may have a reactivity with a selenium-containing gas lower than that of the web substrate 100 and preferably does not react with the selenium-containing gas. Preferably, the reactivity is low enough such that the emissivity of the protective layer remains substantially constant during the following process for making the structure shown in FIG. 1. For example, the variation of the protective layer emissivity is within +/−0.2 during the CIGS layer deposition.

In a preferred embodiment, the protective layer 102 comprises at least one transition metal layer intentionally doped (i.e., intentionally alloyed) with at least one of oxygen or nitrogen. Alternatively, the protective layer 102 may be any other suitable material which has an emissivity greater than 0.25 and which can tolerate high temperature process under a selenium-containing atmosphere, for example, a carbon-based material, such as an amorphous carbon film, a carbon nanotube film, and other carbon-based materials.

In some embodiments, the first electrode 202, specifically, the first electrode conductor layer 202A, comprises molybdenum which is substantially free of oxygen or nitrogen; and the protective layer 102 comprises molybdenum which is intentionally doped by (i.e., alloyed with) at least one of oxygen or nitrogen. As used herein, the term "substantially free of oxygen or nitrogen" means that no oxygen or nitrogen is intentionally alloyed or doped, but the molybdenum may comprise unavoidable impurities of oxygen or nitrogen each having an atomic concentration of up to 5%, such as 0-3%. Preferably, the protective layer 102 comprises oxygen-containing molybdenum having an oxygen atomic concentration of higher than 10%, such as 15-50%, and/or a nitrogen doped molybdenum having a nitrogen atomic concentration of higher than 10%, such as 15-50%. Layer 102 may contain 15-50 atomic percent of a combination of oxygen and nitrogen. In a non-limiting example, a protective layer 102 is a molybdenum oxide layer containing about 70 atomic percent molybdenum and about 30 atomic percent oxygen. A noted above, 10-50% of oxygen (or nitrogen) may be substituted by selenium during the reactive sputtering deposition of CIGS, such that the protective layer 102 contains around 10 atomic percent selenium, around 20 atomic percent oxygen, and around 70 atomic percent molybdenum. Preferably, the protective layer is thick enough such that a portion of the protective layer adjacent to the substrate is substantially free of selenium (having a selenium concentration less than 5 atomic percent).

In some embodiments, if the heat input is non-uniform across the web width, the concentration of oxygen or nitrogen across the web width may be intentionally varied to tune the emissivity profile across the web width. The profile of oxygen or nitrogen of the protective layer 102 across the web width can be tuned to make the emissivity graded across the web width, compensating for the non-uniformity of the net heat input in such a way that the temperature difference across the web width is within ±5° C., such as within ±2° C. The source of inhomogeneous (i.e. non-uniform) net heat input may include inhomogeneous distribution of heaters, inhomogeneous heat losses to the sputter chamber or shields, inhomogeneous emissivity of the web, such as different emissivities in the front of the substrate, such as in the CIGS layer, or inhomogeneous plasma heating from the magnetron sputtering on the front side of the substrate.

The amount of oxygen or nitrogen in the protective layer 102 across the web width may be varied to compensate for the non-uniformities described above. In some embodiments, the step of depositing the protective layer 102 comprises sputtering a metal source in a sputtering atmosphere comprising oxygen-containing and/or nitrogen-containing gas. In other embodiments, a metal oxide or a metal nitride source may be used as the sputtering target instead. The inhomogeneous profile of oxygen or nitrogen in the protective layer 102 across the web width may be provided by introducing different amounts of oxygen or nitrogen to different width sections of the web 100. For example, the oxygen or nitrogen source gas may be fed to the substrate at two or more locations with independently controllable mass flow during the reactive sputtering of the protective layer 102. Alternatively, the emissivity of the protective layer 102 may be tuned by controlling the metal deposition rate across the web width, while the source gas concentration is kept constant.

In some embodiments, the protective layer 102 has a first thickness, and the first electrode 202, including the layer 202A and optionally the barrier layer 202B, has a second thickness different from the first thickness. For example, the protective layer may have a first thickness of 300 Å to 1000 Å, and the first electrode 202 may have a second thickness of 5000 Å to 15000 Å. Layer 202A may be five to fifteen times thicker than layer 102. In some other embodiments, the protective layer 102 has a first density, and the layer 202A has a second density different from the first density. Preferably, the first density is at least 30% higher, such as 30 to 100% higher than the second density. In some other embodiments, the protective layer has a first stress state, and the first electrode has a second stress state different from the first stress state. For example, the first stress state may be tensile stress, while the second stress state is compressive stress. Thus, the protective layer preferably does not act as a strain compensation layer for the first electrode.

Still referring to FIG. 1, at least one p-type semiconductor absorber layer 301 is located over the first electrode 202, and an n-type semiconductor layer 302 is located over the p-type semiconductor absorber layer 301. In preferred embodiments, the p-type semiconductor absorber layer 301 may comprise a CIS based alloy material selected from copper indium selenide, copper indium gallium selenide, or copper indium aluminum selenide. Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom for each one of Group III atom and each two of Group VI atoms. The n-type semiconductor layer 302 may comprise any suitable n-type semiconductor materials, for example, but not limited to, ZnS, ZnSe, or CdS.

A second electrode 400, also referred as a transparent top electrode, is further located over the n-type semiconductor layer 302. The transparent top electrode 400 may comprise multiple transparent conductive layers, for example, but not limited to, an indium tin oxide (ITO) layer 402 located over a resistive aluminum zinc oxide (RAZO) or intrinsic zinc oxide (i-ZnO) layer 401. Of course, the transparent top electrode 400 may comprise any other suitable materials, for example, ZnO or SnO.

Optionally, one or more antireflection (AR) films (not shown) may be deposited over the transparent top electrode 400, to optimize the light absorption in the cell, and/or current collection grid lines may be deposited over the top conducting oxide.

In a preferred embodiment, at least two of the protective layer 102, the first electrode 202, the at least one p-type semiconductor absorber layer 301, the n-type semiconductor layer 302, and the second electrode 400 may be deposited by sputtering in a same sputtering apparatus, with or without breaking vacuum. More preferably, the steps of depositing the protective layer 102, depositing the first electrode 202, depositing the at least one p-type semiconductor absorber layer 301, depositing the n-type semiconductor layer 302, and depositing the second electrode 400 comprise sputtering the protective layer, one or more conductive films of the first electrode, the p-type absorber layer, the n-type semiconductor layer and one or more conductive films of the second electrode over the substrate 100 (preferably a web substrate in this embodiment) in corresponding one of a plurality of independently isolated, connected process modules, while, at the same time, passing the metallic web substrate from an input module to an output module through the plurality of independently isolated, connected process modules such that the web substrate continuously extends from the input module to the output module while passing through the plurality of the independently isolated, connected process modules.

Figure 2:
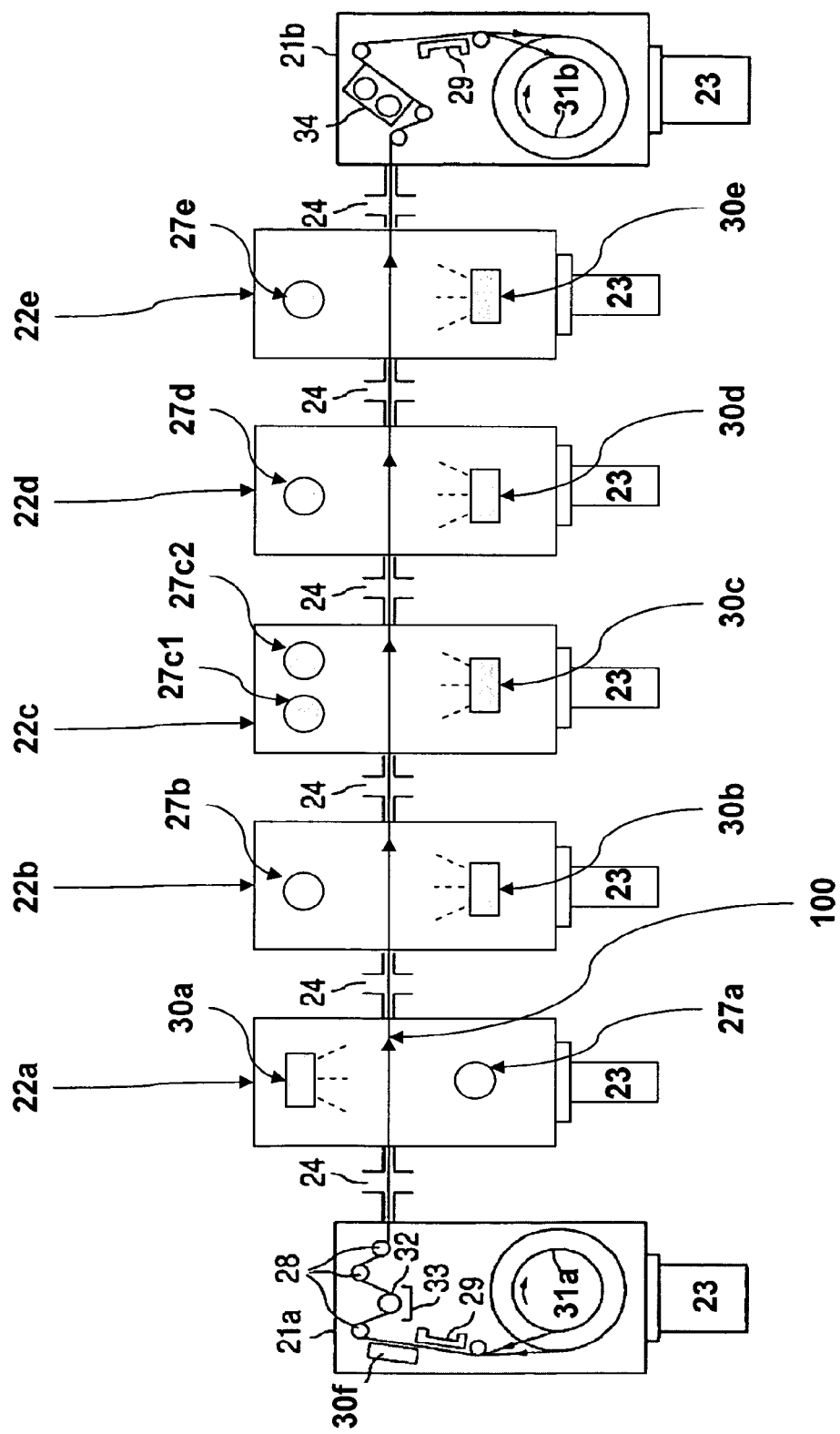
FIG. 2 shows a highly simplified schematic diagram of the top view of a modular sputtering apparatus that can be used to manufacture the solar cell depicted in FIG. 1.

For example, a modular sputtering apparatus for making the solar cell, as illustrated in FIG. 2 (top view), may be used for depositing the full stack of the layers. The apparatus is equipped with an input, or load, module 21a and a symmetrical output, or unload, module 21b. Between the input and output modules are process modules 22a, 22b, 22c, 22d, and 22e. Each process modules may be a sputter module. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module could have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired.

The web substrate 100 is moved throughout the machine by rollers 28, or other devices. Additional guide rollers may be used. Rollers shown in FIG. 2 are schematic and non-limiting examples. Some rollers are bowed to spread the web, some move to provide web steering, some provide web tension feedback to servo controllers, and others are mere idlers to run the web in desired positions. The input spool 31*a* and optionally output spool 31*b* thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the metal web 100, instead of being rolled up onto output spool 31*b*, may be sliced into solar modules by the web splicing device 29 in the output module 21*b*. In these embodiments, the output spool 31*b* may be omitted.

Heater arrays 30 are placed in locations where necessary to provide web heating depending upon process requirements. These heaters 30*a-e* may be a matrix of high temperature quartz lamps laid out across the width of the web. Infrared sensors provide a feedback signal to servo the lamp power and provide uniform heating across the web. In one embodiment, as shown in FIG. 2, the heaters are placed on one side of the web 100, and magnetron housings 27*a-e* are placed on the other side of the web 100. The magnetron housing 27 may house dual cylindrical rotary magnetron(s), or planar magnetron(s) sputtering sources.

After being pre-cleaned, the web substrate 100 may first pass by heater array 30*f* in module 21*a*, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web. Direct sputter cleaning of a conductive web will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the first process module 22*a* through valve 24. The web 100 is maintained at an appropriate process temperature by heater array 30. Following the direction (imaginary arrows along the web 100 in FIG. 2), the full stack of layers may be deposited in one continuous process.

The protective layer 102 may be sputtered in the process module 22*a* onto the back surface of the web 100. Thus, as shown in FIG. 2, the heater 30*a* and the magnetron(s) 27*a* are arranged in the process module 22*a* in a way opposite to that in process modules 22*b*-22*e* that are used to deposit layers onto the front surface of the substrate 100.

The web 100 then passes into the next process module, 22*b*, for deposition of the first electrode 202 onto the front surface of the web 100. Optionally, one or more process modules may be added between the process modules 22*a* and 22*b*, to sputter one or more barrier layers 202B between the front surface of the web 100 and the first electrode conductor layer 202A.

In one embodiment, the protective layer 102 may comprise at least one metal layer intentionally doped with at least one of oxygen or nitrogen. The oxygen or nitrogen doping may be achieved by sputtering a metal target, such as a molybdenum target, in a sputtering atmosphere comprising at least 10% (molar percent), for example at least 20%, of oxygen-containing and/or nitrogen-containing gas. In contrast to the step of sputtering the protective layer 102, the step of depositing the first electrode 202, and particularly layer 202A of electrode 202, comprises sputtering a conductive target, such as a molybdenum target in a sputter atmosphere substantially free of oxygen and nitrogen. Any suitable oxygen-containing gas, such as $O_2$ and $H_2O$, may be used to deposit a protective layer that is doped by oxygen. Any suitable nitrogen-contain gas, such as $N_2$ and $NH_3$, may be used to deposit a protective layer that is doped by nitrogen. A mixture of oxygen-containing gas and nitrogen-containing gas, for example, air, may be used to deposit a protective layer that is doped by both oxygen and nitrogen. In a preferred embodiment, the step of depositing the protective layer comprises sputtering a metal target, such as a molybdenum target, in a sputtering atmosphere containing argon gas and oxygen-containing gas with a molar ratio of argon gas to oxygen-containing gas of less than 5:1, more preferably less than 4:1, such as 1:5 to 5:1, for example, 1:1 to 8:3. In some other embodiments, molar ratio of argon gas to oxygen-containing gas may be smaller than 8:1, such as 1:5 to 8:1. While molybdenum is preferred as the material of the protective layer 102 and the first electrode conductor layer 202A, other materials may also be used for the protective layer 102 and the first electrode layer 202A.

In some embodiments, the step of depositing the protective layer 102 comprises sputtering a conductive target under a first pressure, and the step of depositing the first electrode 202, particularly layer 202A, comprises sputtering a conductive target under a second pressure lower than the first pressure. For example, the first pressure may be around 3 mTorr or higher, such as 3-10 mTorr, while the second pressure may be around 1.5 m Torr or lower, such as 0.1-1 mTorr. Thus, layer 102 has a higher density than layer 202A.

The web 100 then passes into the next process module, 22*c*, for deposition of the at least one p-type semiconductor absorber layer 301. In a preferred embodiment shown in FIG. 3, the step of depositing the at least one p-type semiconductor absorber layer 301 includes reactively alternating current (AC) magnetron sputtering the semiconductor absorber layer from at least one pair of two conductive targets 27*c*1 and 27*c*2, in a sputtering atmosphere that comprises argon gas and a selenium-containing gas. In some embodiment, the pair of two conductive targets 27*c*1 and 27*c*2 comprise the same targets. For example, each of the at least two conductive targets 27*c*1 and 27*c*2 comprises copper, indium and gallium, or comprises copper, indium and aluminum. The selenium-containing gas may be hydrogen selenide or selenium vapor. In other embodiments, targets 27*c*1 and 27*c*2 may comprise different materials from each other.

The radiation heaters 30*a-f* maintain the web at the required process temperature, for example, around 400-800°

C., for example around 500-600° C., which is preferable for the CIS based alloy deposition. The protective layer 102, which has a reduced reactivity with the selenium-containing gas, protects the back surface of the web 100 from reacting with the selenium-containing gas during the step of depositing the at least one p-type semiconductor absorber layer 301. In addition, as explained above, the protective layer 102, having an emissivity greater than 0.3, absorbs at least 30% of the incident radiation from the radiation heaters 30b through 30e. The greater emissivity of the protective layer 102, compared to the first electrode 202 and the substrate 100, reduces the energy consumption of the process, by enabling the radiation heaters 30a-f to operate under a lower power, while heating the web substrate 100 to a desired temperature. In some embodiments, if desired, the profile of the emissivity across the web width can be adjusted to compensate the non-uniformities in the heating profile (as supplied by the radiation heaters 30a-f), in order to improve the uniformity of the temperature profile across the web width.

Figure 3:
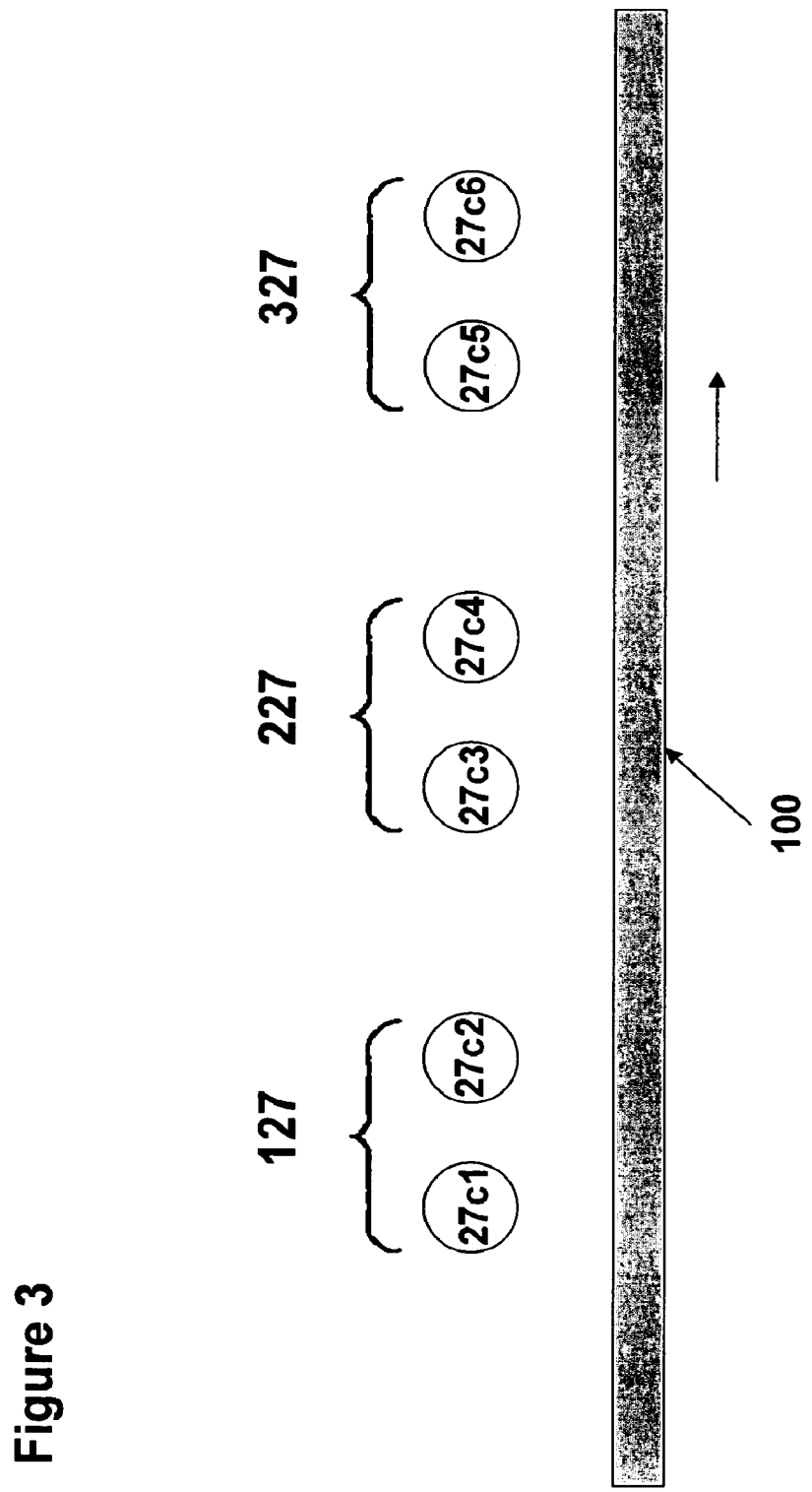
FIG. 3 illustrates schematically the use of three sets of dual magnetrons to increase the deposition rate and grade the composition of the CIS layer to vary its band gap.

In some embodiments, at least one p-type semiconductor absorber layer 301 may comprise graded CIS based material. In this embodiment, the process module 22c further comprises at least two more pairs of targets (227, and 327), as illustrated in FIG. 3. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIS material is described in the Hollars published application, which is incorporated herein by reference in its entirety.

The web 100 may then pass into the process module 22d and 22e, for depositing the n-type semiconductor layer 302, and the transparent top electrode 400, respectively. Any suitable type of sputtering sources may be used, for example, rotating AC magnetrons, RF magnetrons, or planar magnetrons may be used. Extra magnetron stations (not shown), or extra process modules (not shown) could be added for sputtering the optional one or more AR layers.

Finally, the web 100 passes into output module 21b, where it is either wound onto the take up spool 31b, or sliced into solar cells using cutting apparatus 29. While sputtering was described as the preferred method for depositing all layers onto the substrate, some layers may be deposited by MBE, CVD, evaporation, plating, etc., while, preferably, the CIS based alloy is reactively sputtered.

NON-LIMITING EXAMPLES

Example 1

Figure 4C:
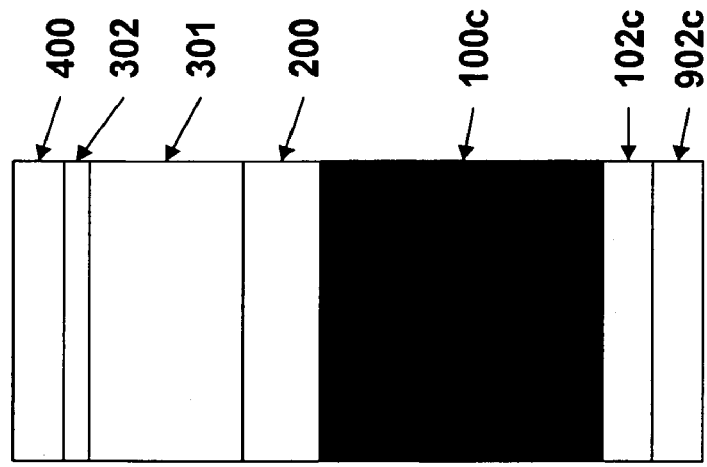
FIGS. 4a through 4c illustrate cross-sectional top views of Samples 1a through 1c in Example 1, respectively.
Figure 4B:
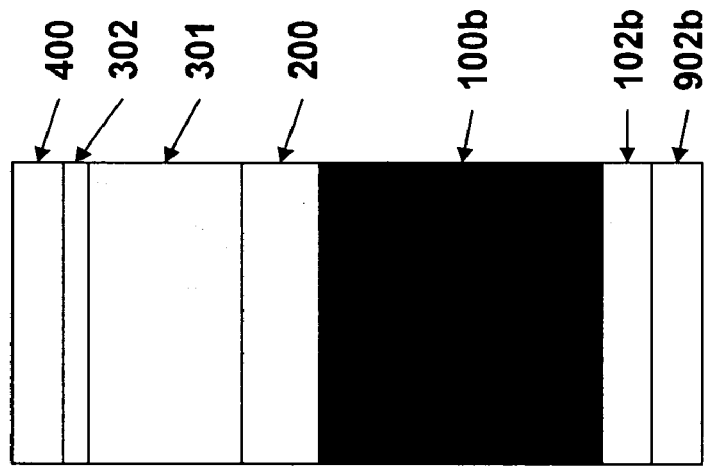
Figure 4A:
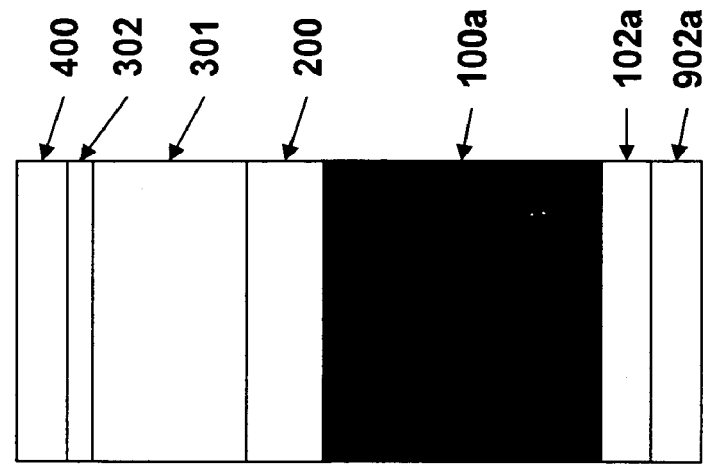

In non-limiting Example 1, three steel web substrates 100 are provided as a starting material for making Samples 1a, 1b and 1c that have structures illustrated in FIGS. 4a, 4b and 4c, respectively.

Sample 1a is prepared by first depositing an about 300 Å thick Mo layer 102a onto the back side of a steel web 100. The first electrode layer 200, CIGS layer 301, n-type semiconductor layer 302 and the second electrode layer 400 are then deposited over the front side of the web 100, followed by depositing an about 500 Å thick cap Mo layer 902a over layer 102a.

Sample 1b is prepared by firstly depositing an about 650-900 Å thick oxygen-containing Mo layer 102b onto the back side of a steel web 100. The first electrode layer 200, CIGS layer 301, n-type semiconductor layer 302 and the second electrode layer 400 are then deposited over the front side of the web 100, followed by depositing an about 500 Å thick cap Mo layer 902b over the layer 102b. The oxygen-containing Mo layer 102b is deposited by sputtering Mo onto the back side of the steel web in an oxygen atmosphere. The total mass flow of oxygen to the sputtering chamber is 15-30 sccm during the step of sputtering the oxygen-containing Mo layer 102b.

Sample 1c is prepared by substantially the same process as Sample 1b, except that the deposited oxygen-containing Mo layer 102c is about 450-700 Å thick, which is thinner than layer 102b of Sample 1b.

Auger Electron Spectroscopy (AES) is performed on the back side of Samples 1a through 1c. The depth profile of components of the films deposited over the back side of web 100 are then deducted and demonstrated in FIGS. 5a through 5c.

Figure 5A:
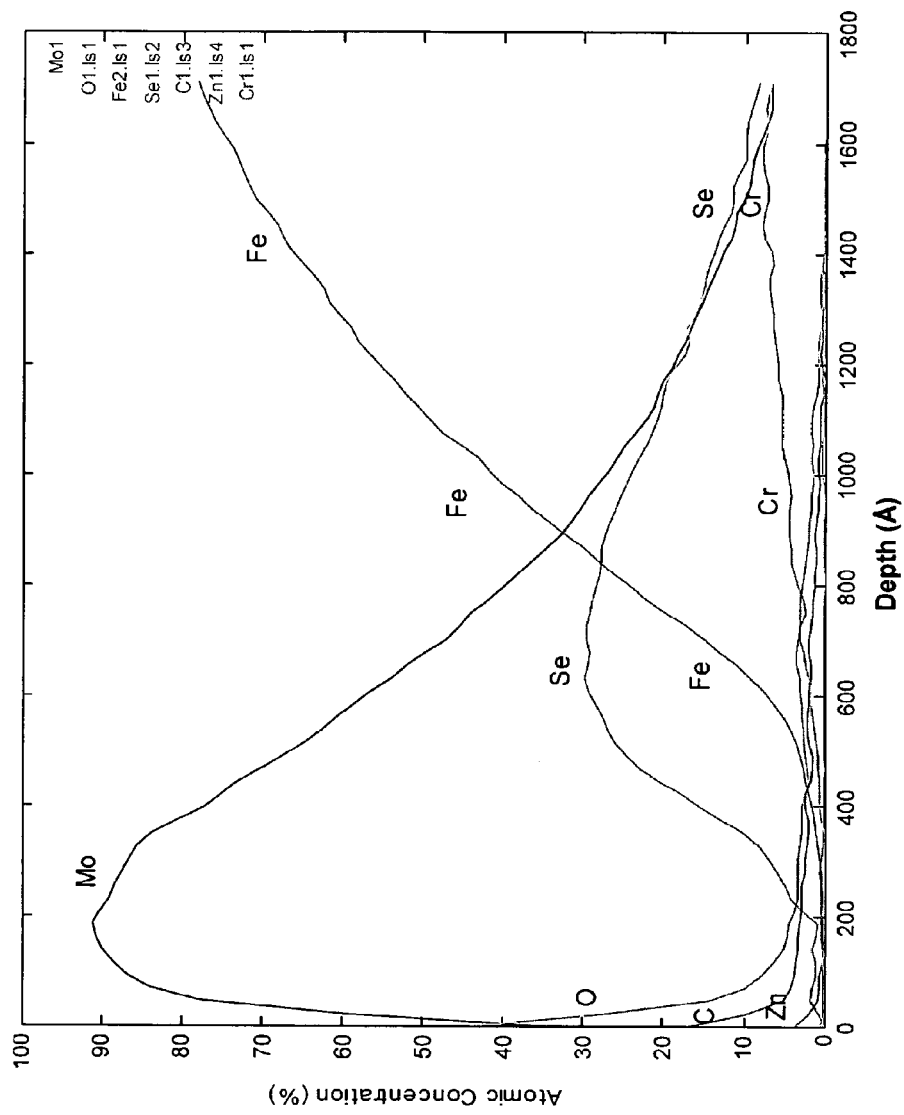
FIGS. 5a through 5c show atomic concentrations of Mo, Fe, Se, C, O, Zn and Cr across the depth of the films deposited onto the back side of an iron web.

As shown in FIG. 5a, Sample 1a contains a total back side Mo layer thickness of approximately 800 Å. The interface of layer 102a and cap layer 902a are not resolvable, possibly due to interdiffusion of Mo, Fe and Se between layer 102a and layer 902a. Oxygen is not detected throughout the Mo layers 102a and 902. Se is detected at up to 200 Å below the surface of layer 902a, and Fe is detected starting from 300 Å below the surface. A high degree of Fe and Se mixing is observed throughout layer 102a, at the interface of layer 102a and web substrate 100, and at the interface of layer 102a and layer 902a. This depth profile suggests that the first Mo layer 102a, which is substantially free of oxygen, is too thin to prevent FeSe formation during the step of deposing the CIGS layer 301.

Figure 5B:
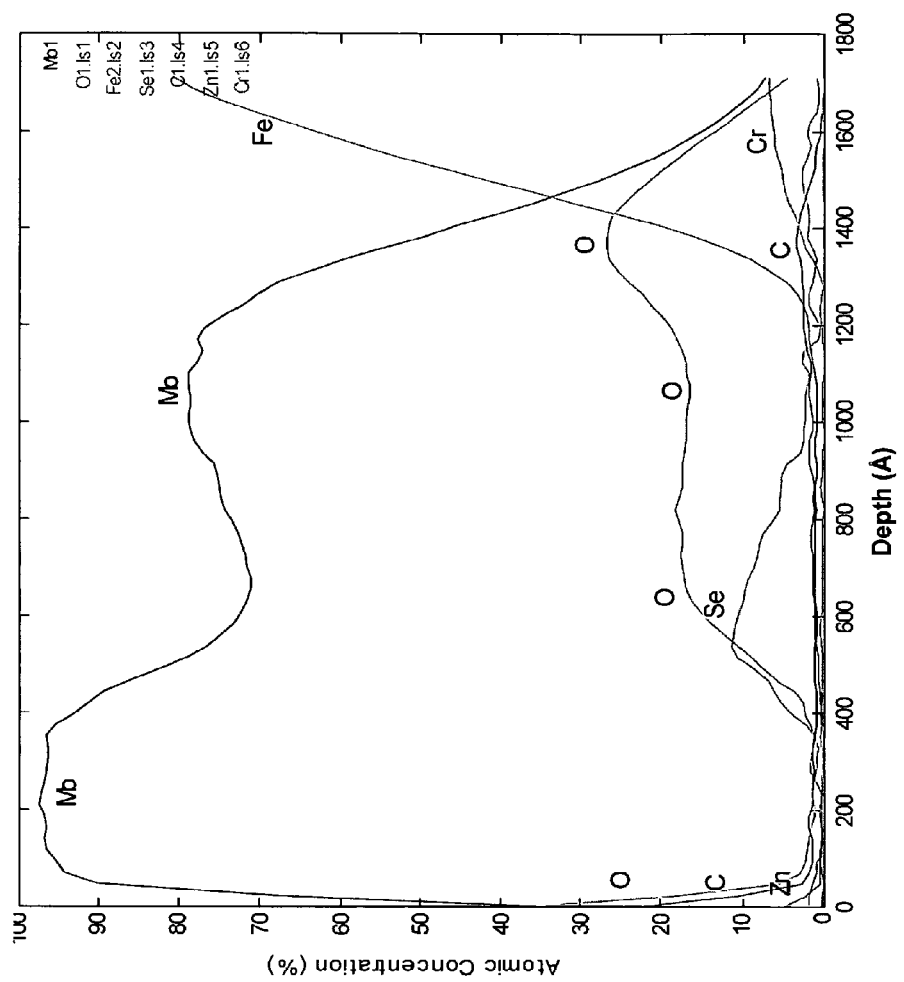

Referring to FIG. 5b, Sample 1b contains an oxygen-containing Mo layer 102b having a thickness of around 900 Å and a cap Mo layer 902b having a thickness of 500 Å. Oxygen content is about 17% in layer 102b and reaches a peak of 25% at the interface of layer 102b and web substrate 100. Se is detected near the interface of the layer 102b and layer 902b, showing significant Se diffusion into layer 102b during the process, leaving about 20% oxygen and 10% Se in the oxygen-containing Mo layer 102b. Nevertheless, the inner portion of the oxygen-containing Mo layer 102b still remains substantially free of Se (less than ~5%). Se is also detected from 400 Å to 500 Å below the surface of layer 902b but no in the outer portion, which may be explain by that Se diffusion from layer 102b to layer 902b during or after the deposition of layer 902b. No Fe is detected in layer 902b, and a very low level of Fe was detected in layer 102b and the interface of layer 102b and layer 902b, suggesting that FeSe formation during the step of depositing CIGS layer 301 may be significantly reduced by the protective layer 102b.

Figure 5C:
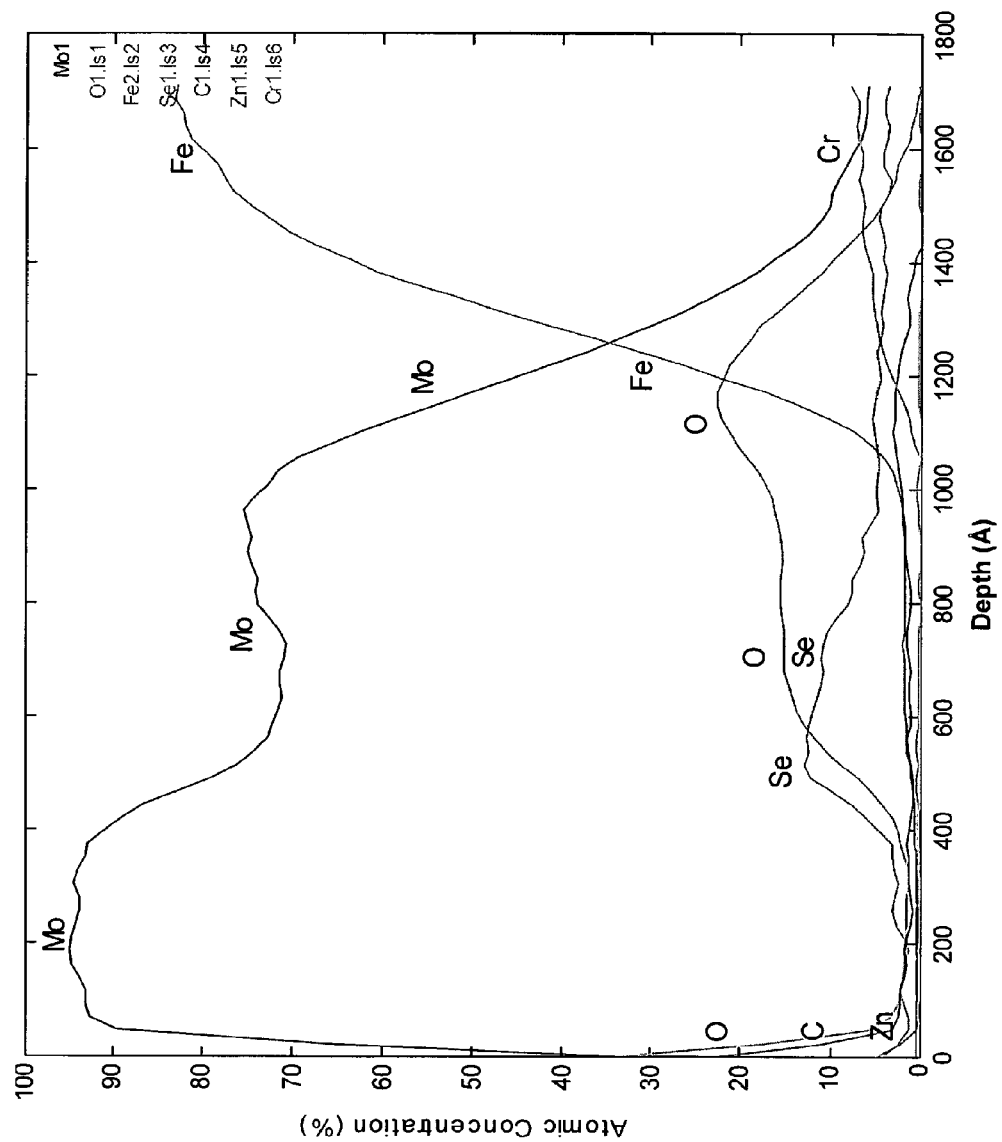

Turning to FIG. 5c, Sample 1c contains an oxygen-containing Mo layer 102c having a thickness of about 700 Å (about 200 Å thinner than layer 102b of Sample 1b). The oxygen-containing Mo layer 102c has substantially the same oxygen concentration as layer 102b in Sample 1b. However, a higher level of Fe was detected in Sample 1c throughout the oxygen-containing Mo layer 102c. Presumably, the amount of FeSe particles formed in Sample 1c may be reduced compared to a bare steel web with no protective layer in place, but greater compared to that in Sample 1b.

In conclusion, an oxygen-containing Mo layer, preferably having a thickness around or greater than 300 Å, preferably around or greater than 500 Å, preferably around or greater than 700 Å, preferably around or greater than 900 Å, may be used to protect the back side of the steel web from reacting with the selenium-containing gas during the reactive sputtering of CIGS layer 301, and thus to reduce the amount of FeSe particles formed during the step of depositing the CIGS layer 301.

Example 2

As explained previously, temperature is an important factor for depositing high-quality CIGS layers having optimum electrical and mechanical properties. Thus, it is important to keep the emissivity of the web back side constant during the process to provide a constant temperature profile.

In non-limiting Example 2, the reflectivity profiles across the web width before (Samples 2b and 2d) and after (Samples 2a and 2c) the step of CIGS deposition are studied. Sample 2a contains a 600 Å thick protective layer over the back side of the steel web deposited by reactively sputtering Mo with an oxygen flow rate of 20 sccm, followed by a CIGS deposition over the front side of the steel web. Sample 2b contains a 600 Å thick protective layer over the back side of the steel web deposited by reactively sputtering Mo with an oxygen flow at a rate of 20 sccm, and no CIGS deposition has been conducted before the reflectivity measurement. Sample 2c contains a 100 Å thick undoped Mo layer over the back side of the steel web deposited by sputtering Mo with no oxygen flow, followed by a CIGS deposition over the front side of the steel web. Sample 2d contains a 100 Å thick undoped Mo layer over the back side of the steel web deposited by sputtering Mo with no oxygen flow, and no CIGS deposition has been conducted before the reflectivity measurement.

Figure 6A:
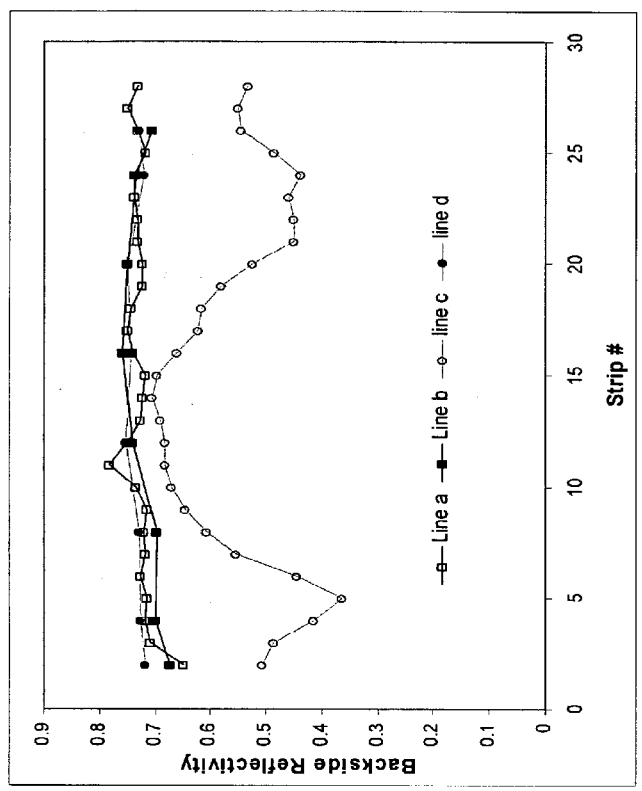
FIG. 6a demonstrates the reflectivity of the web back side at a wavelength of 2.0 μm on various strips across the width of the web. Lines a through d in FIG. 6a refer to the reflectivity measured on Samples 2a through 2d in Example 2, respectively. The strip number starts from the bottom of the web and increases across the width to the top of the web, as illustrated in FIG. 6b, a projection view of the web.
Figure 6B:
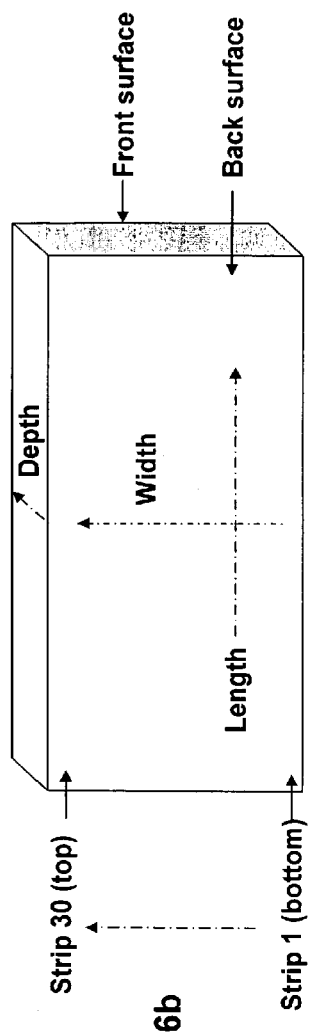

The total reflectivity (R) at a wavelength of 2.0 µm across the web width is then measured by Lamba-19, a model of UV/Vis/NIR spectrometer manufactured by Perkin-Elmer, and presented in FIG. 6a. Strip numbers refer to the relative positions of the regions on which the reflectivity is measured. The strip number starts from the bottom of the web and increases across the width to the top of the web, as shown in FIG. 6b. Lines a through d in FIG. 6a refer to the reflectivity measured on Samples 2a through 2d, respectively.

As shown in FIG. 6a, the reflectivity of the edge regions (strips 1-5 and 20-25) of the web covered by undoped Mo protective layer drops from about 0.7 before CIGS deposition (Sample 2d) to around 0.45 after the CIGS deposition (Sample 2c). It is believed that this non-uniformity may be due to FeSe particle formation on the surface. The temperature of the web edges is about 20-30° C. higher than that of the middle regions due to the reflectivity change during the CIGS deposition. The temperature profile across the length of the web may also become non-uniform due to the continuous reflectivity change during the CIGS deposition, resulting in unfavorable degradation of the CIGS layer across the depth.

Surprisingly, the reflectivity remains substantially the same before (Sample 2b) and after (Sample 2a) the CIGS deposition, if the back side is covered by oxygen-containing Mo protective layer. Thus, by using an oxygen-containing Mo protective layer, it is possible to keep the temperature profile substantially constant during the CIGS deposition, allowing a deposition of CIGS layer uniform in composition and properties across the width of the web.

Example 3

As explained above, another advantage of depositing an oxygen-containing Mo layer over the back side of the web is that oxygen-containing Mo has a lower reflectivity (higher emissivity) than metallic materials, such as undoped (i.e., unalloyed) Mo or steel.

In non-limiting Example 3, a protective layer is deposited over the back side of a steel web by sputtering Mo in a sputtering atmosphere comprising oxygen. The flow rate of oxygen is varied (0, 10, 20, 30 sccm in each of the four samples, respectively) to tune the concentration of oxygen in the deposited protective layer, and thus to tune the back side reflectivity.

Figure 7:
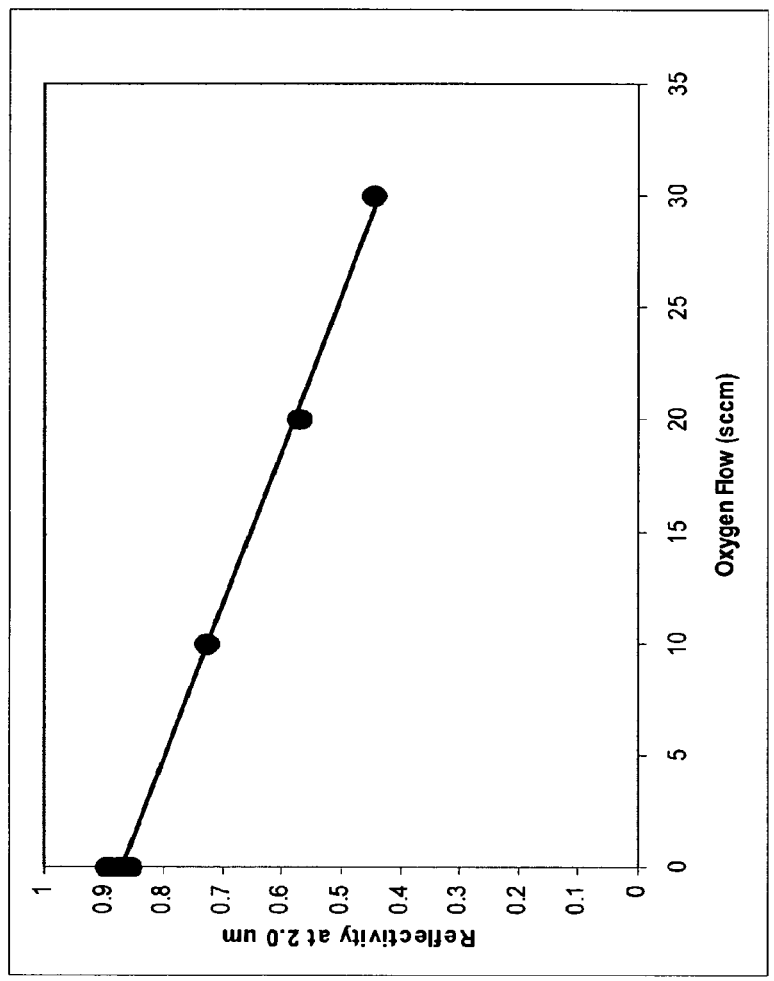
FIG. 7 is a plot of the reflectivity of the web back side at a wavelength of 2.0 μm vs. the oxygen flow during the process of depositing the protective layer in Example 3.

FIG. 7 shows the back side reflectivity of samples measured at a wavelength of 2.0 µm. The back side reflectivity decreases from above 0.7 to below 0.5 when the oxygen flow rate increases from 10 sccm to 30 sccm (i.e., when the oxygen content in the protective layer increases). This lower reflectivity allows the substrate to absorb more incidental light; the radiation heaters can thus be run with less power, improving the energy and cost efficiency of the process.

Example 4

Given a non-uniformity of the heat input in some sputtering apparatus, in order to provide a uniform temperature profile, a protective layer having a non-uniform profile of reflectivity across the width of the web can be used to compensate the non-uniformity of the heat input, such as a non-uniform distribution of heating elements with respect to the width of the substrate.

In non-limiting Example 4, the step of depositing the protective layer comprises sputtering Mo in a sputtering atmosphere having an inhomogeneous partial pressure of oxygen. Oxygen is supplied to the sputtering chamber through four nozzles which are, respectively, located nearby top, upper middle, lower middle and bottom portions of the web that moves in the horizontal direction with one edge pointing at the ground. The flow rate of oxygen is controlled to be 15 sccm (top and bottom nozzles) and 3 sccm (upper middle and lower middle nozzles) respectively to obtain a higher oxygen concentration in edge regions than in middle regions.

Figure 8:
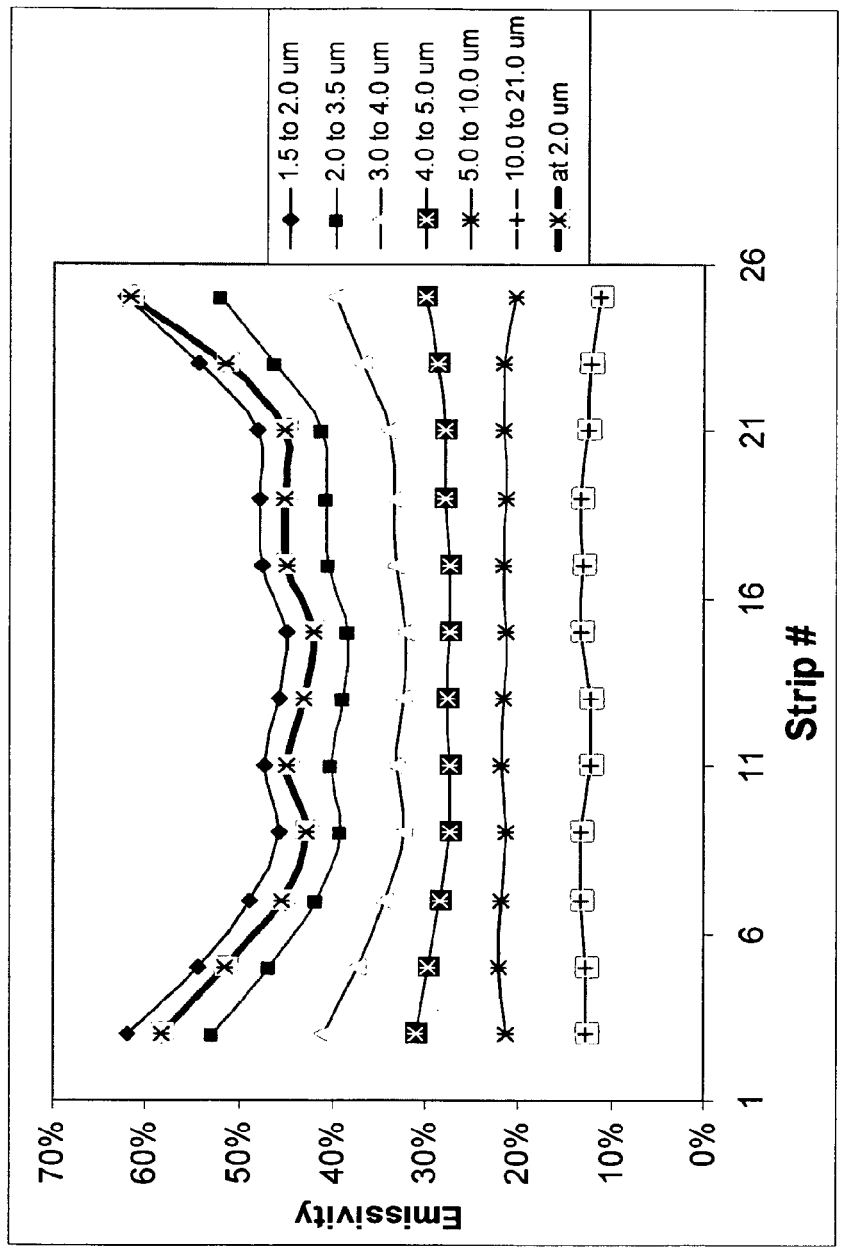
FIG. 8 is a plot of the emissivity of the web back side of samples in Example 4, measured in wavelength bands and at a wavelength of 2.0 μm on various strips across the width of the web. The wavelength bands include 1.5 to 2.0 μm, 2.0 to 3.5 μm, 3.0 to 4.0 μm, 4.0 to 5.0 μm, 5.0 to 10.0 μm, 10.0 to 21.0 μm. The strip number starts from the bottom of the web and increases across the width to the top of the web, as illustrated in FIG. 6b.

As shown in FIG. 8, the emissivity of the web back side across the web width is measured in wavelength bands (1.5 to 2.0 µm, 2.0 to 3.5 µm, 3.0 to 4.0 µm, 4.0 to 5.0 µm, 5.0 to 10.0 µm, 10.0 to 21.0 µm) and at a wavelength of 2.0 µm. While the emissivity is not substantially varied across the web width in wavelength bands of 4.0 to 5.0 µm, 5.0 to 10.0 µm and 10.0 to 21.0 µm, it depends greatly on the oxygen profile in wavelength bands of 1.5 to 2.0 µm, 2.0 to 3.5 µm, 3.0 to 4.0 µm and at 2.0 µm.

The higher emissivity in the edge regions (for example, strips 1-5 and 20-25) allows the web edges to absorb more incidental light, compensating the non-uniformity of the heat input due to the non-uniform radiation source positioning and/or the non-uniform heat loss. For example, a higher edge emissivity may be used to compensate for radiative heating sources positions closer to substrate middle than edges and/or for greater heat loss at web edges, resulting in improved heat coupling at edges. Thus, a more uniform temperature profile may be obtained for depositing a CIGS layer uniformly across the web.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A method of manufacturing a solar cell, comprising:

providing a substrate;

depositing a protective layer over a first surface of the substrate;

depositing a first electrode over a second surface of the substrate;

depositing at least one p-type semiconductor absorber layer over the first electrode, wherein the p-type semiconductor absorber layer includes a copper indium selenide (CIS) based alloy material;

depositing an n-type semiconductor layer over the p-type semiconductor absorber layer to form a p-n junction; and depositing a second electrode over the n-type semiconductor layer; wherein:

the protective layer has an emissivity that remains substantially constant during the step of depositing the at least one p-type semiconductor absorber layer.

2. The method of claim 1, wherein the protective layer comprises at least one carbon based material having an emissivity greater than 0.25.

3. The method of claim 1, wherein:

the protective layer comprises at least one transition metal layer intentionally alloyed with at least one of oxygen or nitrogen; and the protective layer has an emissivity greater than 0.25.

4. The method of claim 1, wherein the protective layer comprises an oxygen-containing molybdenum layer containing greater than 10 atomic % oxygen.

5. The method of claim 1, wherein the emissivity of the protective layer is tuned to provide at least one of a predetermined substrate temperature or reduction of deposition cost.

6. The method of claim 1, wherein the emissivity of the protective layer is tuned to provide a uniform substrate temperature.

7. The method of claim 1, wherein a profile of the emissivity of the protective layer is configured to compensate for a non-uniformity of heat provided by at least one of one or more radiation heaters or edge effects.

8. The method of claim 1, wherein the protective layer has a higher oxygen concentration at edges of the protective layer than in middle.

9. The method of claim 1, wherein the emissivity of the protective layer has a uniform profile across a width of the protective layer.

* * * * *